(12) United States Patent
Hara et al.

(10) Patent No.: US 9,553,614 B2
(45) Date of Patent: Jan. 24, 2017

(54) COMPOSITE MODULE

(71) Applicant: Murata Manufacturing Co., Ltd., Kyoto (JP)

(72) Inventors: Akihiro Hara, Kyoto (JP); Masahiko Ura, Kyoto (JP); Takahiro Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/472,525

(22) Filed: Aug. 29, 2014

(65) Prior Publication Data

US 2014/0378182 A1    Dec. 25, 2014

Related U.S. Application Data (63) Continuation of application No. PCT/JP2013/059461, filed on Mar. 29, 2013.

(30) Foreign Application Priority Data

Apr. 5, 2012    (JP) .................................. 2012-086040

(51) Int. Cl.
   *H04B 1/44*        (2006.01)
   *H04B 1/00*        (2006.01)
   (Continued)

(52) U.S. Cl.
   CPC ................ *H04B 1/006* (2013.01); *H04B 1/40* (2013.01); *H05K 1/0216* (2013.01); *H04W 88/06* (2013.01);
   (Continued)

(58) Field of Classification Search
   CPC ....... H04B 1/005; H04B 1/006; H04B 1/0064; H04B 1/44; H04B 1/48; H04W 88/06
   (Continued)

(56) References Cited

U.S. PATENT DOCUMENTS

| | | | |
|---|---|---|---|
| 7,596,357 B2 | 9/2009 | Nakamata | |
| 2004/0152426 A1* | 8/2004 | Suzuki | H04B 1/48 455/83 |

(Continued)

FOREIGN PATENT DOCUMENTS

| | | |
|---|---|---|
| CN | 1661915 A | 8/2005 |
| CN | 1835411 A | 9/2006 |

(Continued)

OTHER PUBLICATIONS

Office Action issued in corresponding Chinese Patent Application No. 201380014838.X dated Jun. 3, 2015.

(Continued)

*Primary Examiner* — Lee Nguyen
(74) *Attorney, Agent, or Firm* — Pearne & Gordon LLP (57) ABSTRACT

Provided is a technique capable of improving isolation characteristics between a plurality of signal paths through which RF signals pass, without using ground electrodes or the like. Wiring electrodes 10*a* and 20*a* through which RF signals do not pass simultaneously are formed so as to be adjacent to each other in a central region of a component mounting surface 2*a* of a circuit board 2, and wiring electrodes 11*a* and 21*a* through which RF signals pass simultaneously are formed so as to be distanced from transmission paths 10 and 20. Accordingly, the RF signals do not simultaneously pass through the transmission paths 10 and 20, which are disposed near each other, and thus there is no risk that the RF signal passing through one of the signal paths will interfere with the RF signal passing through the other signal path.

6 Claims, 3 Drawing Sheets

(51) Int. Cl.
  *H05K 1/02*   (2006.01)
  *H04B 1/40*   (2015.01)
  *H04B 1/02*   (2006.01)
  *H05K 3/46*   (2006.01)
  *H04W 88/06*  (2009.01)

(52) U.S. Cl.
  CPC ........... *H05K 1/0243* (2013.01); *H05K 3/4629* (2013.01); *H05K 2201/09972* (2013.01)

(58) Field of Classification Search
  USPC .............................. 455/78, 83, 552.1, 553.1
  See application file for complete search history.

(56) References Cited

U.S. PATENT DOCUMENTS

| | | |
|---|---|---|
| 2006/0221926 A1 | 10/2006 | Maekawa |
| 2007/0111790 A1 | 5/2007 | Maekawa |
| 2008/0136559 A1 | 6/2008 | Takahashi |
| 2008/0212552 A1 | 9/2008 | Fukamachi |
| 2009/0147707 A1 | 6/2009 | Koga |
| 2011/0156835 A1 | 6/2011 | Nagai |
| 2011/0181342 A1 | 7/2011 | Uejima |
| 2012/0242394 A1 | 9/2012 | Murase |

FOREIGN PATENT DOCUMENTS

| | | |
|---|---|---|
| CN | 1977467 A | 6/2007 |
| CN | 101197461 A | 6/2008 |
| CN | 101395797 A | 3/2009 |
| CN | 101938286 A | 1/2011 |
| CN | 102138285 A | 7/2011 |
| CN | 102144357 A | 8/2011 |
| CN | 102356510 A | 2/2012 |
| JP | 2007-143155 A | 6/2007 |
| JP | 2007-151123 A | 6/2007 |
| WO | 2010/032389 A1 | 3/2010 |
| WO | 2010032389 A1 | 3/2010 |

OTHER PUBLICATIONS

International Search Report issued in Application No. PCT/JP2013/059461 dated Jul. 2, 2013.

* cited by examiner

COMPOSITE MODULE

BACKGROUND OF THE INVENTION

Field of the Invention

The present invention relates to composite modules including circuit boards on which a plurality of communication systems that communicate using the respective predetermined frequency bands are provided.

Description of the Related Art

Cellular phone terminals configured to be capable of communicating through a plurality of communication standards, such as GSM® (Global System for Mobile Communications), PDC (Personal Digital Cellular), PCS (Personal Communications Service), and CDMA (Code Division Multiple Access), are being provided in recent years. Recently, mobile information terminals such as laptop computers, smartphones, and so on are also being configured to be capable of communicating through a plurality of wireless LAN standards, as typified by IEEE 802.11a/b/g/n or the like. A mobile communication terminal such as a cellular phone terminal or a mobile information terminal that is compliant with a plurality of communication standards in this manner includes a composite module having a circuit board in which a plurality of communication systems, which communicate using the respective predetermined frequency bands defined by those standards, are provided.

A demultiplexing circuit, a switching circuit, and the like for supplying a communication signal (RF signal), which is in a predetermined frequency band inputted from the exterior, to the communication system corresponding to that RF signal, an amplifying circuit such as a power amplifier (PA), a low-noise amplifier (LNA), and the like for amplifying signals inputted from the exterior, signals outputted to the exterior, and so on, are provided on the circuit board of a composite module in which a plurality of communication systems are provided. Meanwhile, mobile communication terminals are becoming smaller in size, and as such, the high-frequency circuit components installed in mobile communication terminals, such as those described above, are also becoming smaller and more highly integrated. Furthermore, the high-frequency circuit components of which each communication system is configured are disposed in close proximity on the circuit board, wiring electrodes that connect the high-frequency circuits provided in each communication system and form signal paths for the RF signals are disposed in close proximity, and so on.

Due to such proximate disposal, there is a risk that the isolation characteristics between the communication systems and the high-frequency circuits will degrade. There is a further risk that the RF signal amplified by the amplifying circuit entering an antenna switching circuit, which includes a demultiplexing circuit, a low-pass filter, and the like, will result in signal loss in the demultiplexing circuit, the antenna switching circuit, and so on, and that the RF signal flowing through the antenna switching circuit entering the amplifying circuit will cause the amplifying circuit to oscillate and become unstable. There has also been a risk that the RF signals in the respective communication systems will interfere with each other and degrade the communication quality in the communication systems.

Accordingly, thus far, a plurality of through-hole electrodes connected to ground electrodes have been provided in locations, of the circuit board on which the composite module is provided, where superior isolation characteristics are required, such as between the respective communication systems, the respective high-frequency circuits, and the respective wiring electrodes that form signal paths through which RF signals pass, in order to prevent the isolation characteristics from degrading between the respective communication systems, the respective high-frequency circuits, and the respective signal paths (see Patent Document 1, for example). For example, a conventional composite module 500 shown in FIG. 4 includes a circuit board 501 within which a plurality of wiring electrodes are provided and a plurality of electrical components 502 mounted on a component mounting surface 501a of the circuit board 501; here, wiring electrodes that configure an amplifying circuit are formed on a left-side region of the circuit board 501, and wiring electrodes that configure a switching circuit are formed on a right-side region of the circuit board 501.

Figure 4:
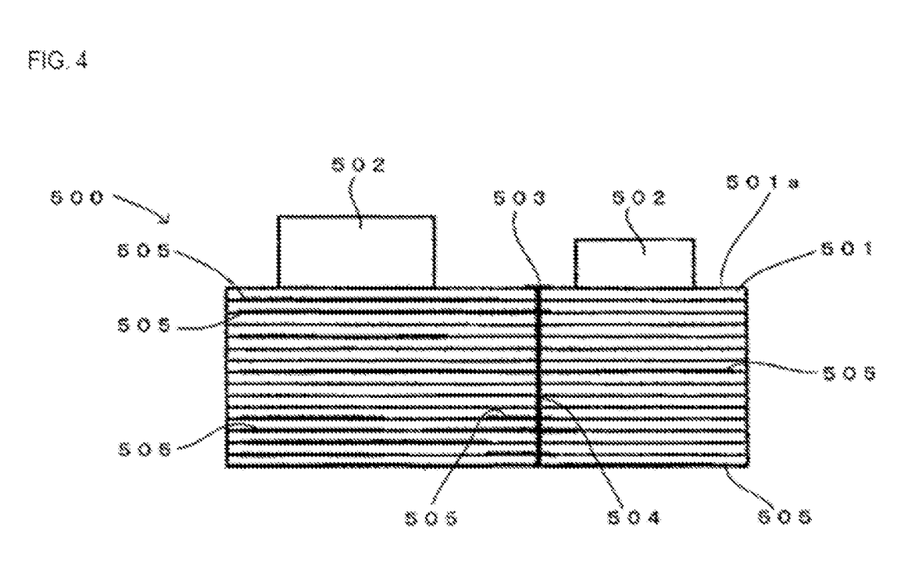
FIG. 4 is a diagram illustrating a conventional composite module.

Furthermore, a shield electrode 503 is provided on the component mounting surface 501a of the circuit board 501, at a border between the left-side region in which the amplifying circuit is provided and the right-side region in which the switching circuit is provided, and a plurality of through-hole electrodes 504 that are connected to the shield electrode 503 and that are formed in the layering direction of the circuit board 501 are provided in tandem along the depth direction in FIG. 4. By connecting the through-hole electrodes 504 to a plurality of ground electrodes 505 provided within the circuit board 501, the RF signals are suppressed from interfering with each other between the amplifying circuit provided in the left-side region of the circuit board 501 and the switching circuit provided in the right-side region of the circuit board 501.

Patent Document 1: Japanese Unexamined Patent Application Publication No. 2007-151123 (paragraph 0043, FIG. 4, abstract, etc.)

BRIEF SUMMARY OF THE INVENTION

Incidentally, in recent years, there have seen a demand for further smaller sizes and thinner profiles in mobile communication terminals, and as such there is a demand for further smaller sizes, thinner profiles, and higher integration in the composite modules provided in such mobile communication terminals. Accordingly, it has been difficult to secure a region for forming the shield electrode 503, the through-hole electrodes 503, and so on in the circuit board 501 as described above in order to improve the isolation characteristics between the respective communication systems provided in the composite module.

Having been achieved in light of the aforementioned problems, it is an object of this invention to provide a technique capable of improving the isolation characteristics between a plurality of signal paths through which RF signals pass, without using ground electrodes or the like.

To achieve the aforementioned object, a composite module according to the present invention is a composite module including a circuit board on which a plurality of communication systems that communicate using the respective predetermined frequency bands are provided, in which each of the communication systems includes a plurality of signal paths through which RF signals pass, and wiring electrodes that form the signal paths, of the plurality of signal paths through which the RF signals do not pass simultaneously, provided respectively in at least two of the communication systems are formed together so as to be adjacent to each other in a predetermined region of the circuit board.

According to the invention configured in this manner, the wiring electrodes that form the signal paths, of the plurality of signal paths through which RF signals do not pass simultaneously, provided respectively in at least two of the communication systems are formed together so as to be adjacent to each other in a predetermined region of the circuit board. Accordingly, the respective wiring electrodes that form the other signal paths in the communication systems can be disposed in other regions of the circuit board so as to be separated from each other. Accordingly, the RF signals do not simultaneously pass through the signal paths that are disposed near each other, and thus there is no risk that the RF signal passing through one of the signal paths will interfere with the RF signal passing through the other signal path. Furthermore, because the other signal paths are distanced therefrom, the isolation characteristics between the plurality of signal paths which are provided in the respective communication systems and through which the RF signals pass can be improved without using ground electrodes or the like as in the past.

Here, a plurality of wiring electrodes that form the signal paths through which the RF signals do not pass simultaneously may be formed together in a central region of the circuit board when viewed from above.

By employing such a configuration, the plurality of wiring electrodes that form the signal paths through which RF signals do not pass simultaneously and which therefore do not carry a risk of mutual interference are formed together in a central region of the circuit board when viewed from above. Accordingly, when the other signal paths provided in the communication systems are disposed on the circuit board, the wiring electrodes that form the respective signal paths can be disposed in a peripheral edge region of the circuit board when viewed from above. This increases the freedom of the locations where the wiring electrode can be disposed on the circuit board, which by extension increases the freedom of design for the composite module.

Here, it is preferable that the wiring electrodes be formed on one main surface of the circuit board.

By employing such a configuration, compared to a case where ground electrodes are provided between the respective wiring electrodes, the wiring electrodes are provided within the circuit board in order to dispose the wiring electrodes so as to be distanced from each other, and so on for the purpose of improving the isolation characteristics between the respective wiring electrodes, as is found in conventional techniques, the wiring electrodes can be formed on the one main surface of the circuit board with a high level of precision by using a technique such as photolithography, screen printing, or the like, and as such, the impedance between the respective wiring electrodes can be adjusted with ease.

Here, it is preferable that the plurality of communication systems be first and second communication systems, each of the first and second communication systems include a transmission path through which the RF signals do not pass simultaneously and a reception path through which the RF signals pass simultaneously as the signal paths, transmission path wiring electrodes that form the respective transmission paths be formed in the circuit board so as to be disposed adjacent to each other when viewed from above, a reception path wiring electrode that forms the reception path of the first communication system be formed in a region of the circuit board that is closer to the first communication system, and a reception path wiring electrode that forms the reception path of the second communication system be formed in a region of the circuit board that is closer to the second communication system.

By employing such a configuration, the transmission path wiring electrodes that form the respective transmission paths through which RF signals do not pass simultaneously in the first and second communication systems are formed adjacent to each other on the circuit board when viewed from above, and the reception path wiring electrodes that form the reception paths through which the RF signals pass simultaneously in the first and second communication systems are formed in the region of the circuit board on the side on which the corresponding first or second communication system is provided. Accordingly, the respective reception paths in the first and second communication systems are disposed so as to be distanced from each other with the respective transmission paths, which are disposed adjacent to each other but have no risk of interfering with each other, provided therebetween; as such, the RF signal from one of the communication systems can be prevented from entering the other communication system, which makes it possible to improve the isolation characteristics between the first and second communication systems.

Here, it is preferable that the first communication system include a first antenna terminal and the second communication system include a second antenna terminal, the first antenna terminal be formed at an end edge of a region of the circuit board in which the transmission path wiring electrode and the reception path wiring electrode of the first communication system are formed, and the second antenna terminal be formed at an end edge of a region of the circuit board in which the transmission path wiring electrode and the reception path wiring electrode of the second communication system are formed.

By employing such a configuration, although the first communication system includes the first antenna terminal and the second communication system includes the second antenna terminal, the first antenna terminal is formed at an end edge of the region of the circuit board in which the transmission path wiring electrode and the reception path wiring electrode of the first communication system are formed, and the second antenna terminal is formed at an end edge of the region of the circuit board in which the transmission path wiring electrode and the reception path wiring electrode of the second communication system are formed. Accordingly, although RF signals for communications are inputted and outputted via the first and second antenna terminals, the first and second antenna terminals are disposed distanced from each other on the circuit board. Accordingly, the RF signals used in the respective communication systems can be prevented from interfering with each other through the respective antenna terminals, and the isolation characteristics between the first and second communication systems can be further improved.

Advantageous Effects of Invention

According to the present invention, the wiring electrodes that form the signal paths, of the plurality of signal paths through which RF signals do not pass simultaneously so that there is no risk of the RF signal passing through one of the signal paths interfering with the RF signal passing through the other signal path, provided respectively in at least two of the communication systems are formed together so as to be adjacent to each other in a predetermined region of the circuit board. Accordingly, the other signal paths are disposed so as to be distanced therefrom, which makes it possible to improve the isolation characteristics between the plurality of signal paths which are respectively provided in the plurality of communication systems and through which the RF signals pass without using ground electrodes or the like as in the past.

DETAILED DESCRIPTION OF THE INVENTION

Figure 1:
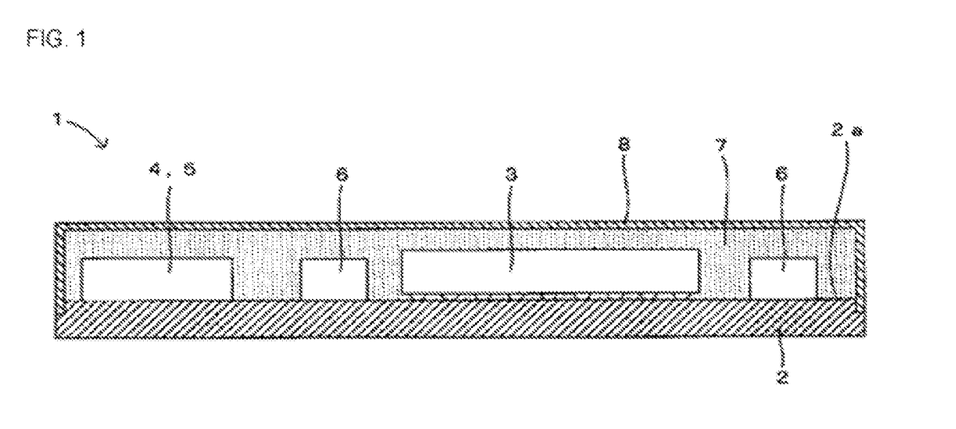
FIG. 1 is a cross-sectional view illustrating a composite module according to an embodiment of the present invention.
Figure 2:
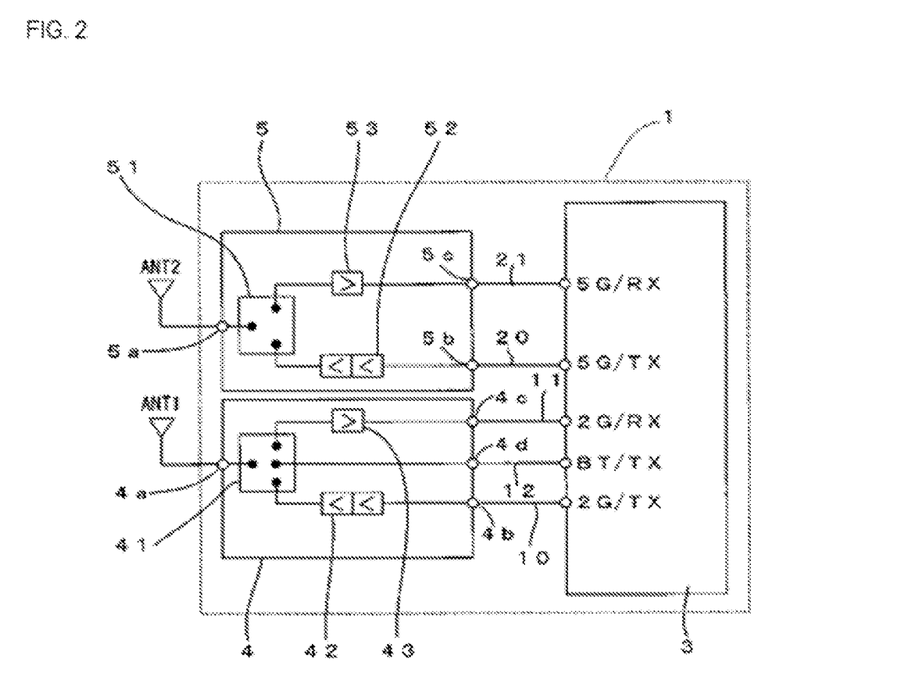
FIG. 2 is a circuit function block diagram illustrating a circuit configuration of the composite module shown in FIG. 1.
Figure 3:
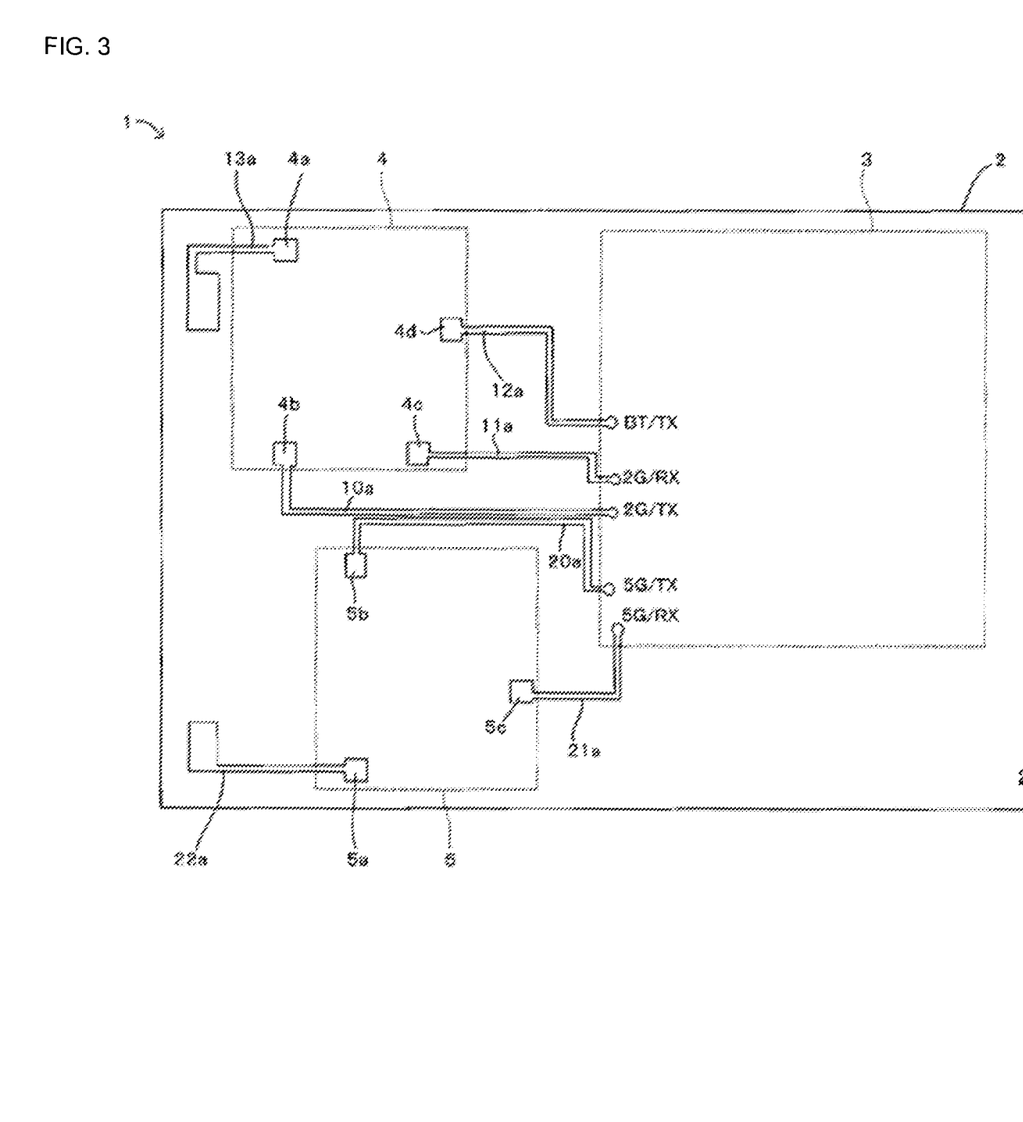
FIG. 3 is a plan view illustrating a circuit board provided in the composite module shown in FIG. 1.

A composite module according to an embodiment of the present invention will be described with reference to FIGS. 1 to 3. FIG. 1 is a cross-sectional view illustrating a composite module according to an embodiment of the present invention. FIG. 2 is a circuit block diagram illustrating a circuit configuration of the composite module shown in FIG. 1. FIG. 3 is a plan view illustrating a circuit board provided in the composite module shown in FIG. 1. Note that to facilitate the descriptions, FIGS. 1 to 3 illustrate only the configurations necessary to describe the present invention, and other configurations have been omitted from the drawings.

Composite Module

A composite module 1 illustrated in FIG. 1 is provided on a motherboard or the like included in a mobile communication terminal such as a cellular phone terminal, a mobile information terminal, or the like, and in this embodiment, includes a circuit board 2, an RFIC 3 having communication functions based on a plurality of communication standards that use RF signals in the 2.4 GHz and 5 GHz bands, front-end modules (FEMs) 4 and 5 that are provided corresponding to the RF signals in the 2.4 GHz and 5 GHz bands, respectively, and that include an amplifying circuit and a switching circuit, and various types of components 6 such as filters, resistances, capacitors, coils, and so on. The RFIC 3, the FEMs 4 and 5, and the components 6 mounted on a component mounting surface 2a of the circuit board 2 are covered by a typical molded resin 7 such as an epoxy resin, and a shield layer 8 formed from a silver paste, for example, is provided on a surface of the molded resin 7. Note that the shield layer 8 is provided within the circuit board 2 and is connected to a ground electrode (not shown) that is exposed from a surface of an outer side portion of the circuit board 2.

The RFIC 3, the FEMs 4 and 5, and the components 6 are attached to wiring electrodes provided on the mounting surface 2a of the circuit board 2, are connected to each other via the wiring electrodes provided on the mounting surface 2a and within the circuit board 2, and are electrically connected to a plurality of mounting electrodes (not shown) formed on a rear surface of the circuit board 2. By mounting the composite module 1 on the motherboard or the like provided in the mobile communication terminal, the composite module 1 is electrically connected to an antenna line, a ground line, various types of signal lines such as a transmission signal line and a receiving signal line, and a power source line provided in the motherboard; as a result, transmission/receiving signals are inputted and outputted between the motherboard and the composite module 1.

The circuit board 2 in this embodiment is formed of an integrated ceramic multilayer body by layering and firing a plurality of dielectric layers formed from ceramic green sheets. Via conductors and wiring electrodes are formed as appropriate in the respective dielectric layers.

That is, the ceramic green sheets, of which the dielectric layers are formed, are formed by a deposition device creating sheets from a slurry in which mixed particles of alumina, glass, and so on are intermixed with an organic binder, a solvent, and the like, and are formed to be capable of being fired by so-called low-temperature firing, which is carried out at a temperature lower than approximately 1000° C. The respective dielectric layers are formed by forming via holes through laser processing or the like in ceramic green sheets cut into a predetermined shape, forming via conductors for interlayer connections by filling the via holes that have been formed with a conductive paste containing Ag, Cu, or the like, carrying out via-fill plating, or the like, and forming various wiring electrodes by printing using a conductive paste.

Note that circuit elements such as capacitors, coils, and so on may be formed by the wiring electrodes and the via conductors provided in the respective dielectric layers, and filter circuits, matching circuits, and so on may be formed by combining circuit elements such as capacitors, coils, and so on formed by the wiring electrodes and the via conductors.

The RFIC 3 is provided with a communication function based on the Bluetooth® standard, which communicates using the 2.4 GHz band, and a communication function based on the wireless LAN standard (IEEE 802.11a/b/g/n), which communicates using the 2.4 GHz and 5 GHz bands (these correspond to "first and second communication systems" according to the present invention), and as shown in FIG. 3, is disposed on the upper-right when viewing the circuit board 2 from above.

The FEM 4, which is provided for the Bluetooth® standard and the wireless LAN standard that communicate using RF signals in the 2.4 GHz band (the first communication system), is, as shown in FIG. 3, disposed on the upper-left when viewing the circuit board 2 from above. The FEM 4 includes an antenna terminal 4a connected to an antenna ANT1 for the 2.4 GHz band (a "first antenna terminal" according to the present invention), a transmission terminal 4b and a reception terminal 4c that are respectively connected, via a transmission path 10 (signal path) and a reception path 11 (signal path), to a transmission terminal 2G/Tx and a reception terminal 2G/Rx for the RFIC 3 2.4 GHz wireless LAN, and a BT terminal 4d that is connected to a transmission terminal BT/Tx for the RFIC 3 Bluetooth® via a transmission path 12. The FEM 4 also includes a switching circuit 41, a power amplifier (PA) 42 that amplifies a wireless LAN transmission signal (RF signal) outputted from the transmission terminal 2G/Tx and outputs the amplified signal to the switching circuit 41, and a low-noise amplifier (LNA) 43 that amplifies a reception signal (RF signal) inputted via the antenna terminal 4a and outputted from the switching circuit 41 and outputs the amplified signal to the reception terminal 2G/Rx of the RFIC 3 via the reception terminal 4c (the reception path 11).

The switching circuit 41 is connected to the BT terminal 4d, into which a Bluetooth® transmission signal (RF signal) is inputted, and the antenna terminal 4a is selectively connected to one of the transmission terminal 4b, the reception terminal 4c, and the BT terminal 4d by switching the switching circuit 41 based on a switching signal inputted from the motherboard on which the composite module 1 is mounted.

A wiring electrode 13a provided on the component mounting surface 2a of the circuit board 2 and a matching circuit (not shown) formed of components 6 such as a capacitor, an inductor, and the like provided on the wiring electrode 13a, are connected to the antenna terminal 4a.

The FEM 5, which is provided for the wireless LAN standard that communicates using RF signals in the 5 GHz band (the second communication system), is, as shown in FIG. 3, disposed on the lower-left when viewing the circuit board 2 from above. The FEM 5 includes an antenna terminal 5a connected to an antenna ANT2 for the 5 GHz band (a "second antenna terminal" according to the present invention), and a transmission terminal 5b and a reception terminal 5c that are respectively connected, via a transmission path 20 (signal path) and a reception path 21 (signal path), to a transmission terminal 5G/Tx and a reception terminal 5G/Rx for the RFIC 3 5 GHz wireless LAN. The FEM 5 also includes a switching circuit 51, a PA 52 that amplifies a wireless LAN transmission signal (RF signal) outputted from the transmission terminal 5G/Tx and outputs the amplified signal to the switching circuit 51, and an LNA 53 that amplifies a reception signal (RF signal) inputted via the antenna terminal 5a and outputted from the switching circuit 51 and outputs the amplified signal to the reception terminal 5G/Rx of the RFIC 3 via the reception terminal 5c (the reception path 21).

The antenna terminal 5a is selectively connected to one of the transmission terminal 5b and the reception terminal 5c by switching the switching circuit 51 based on a switching signal inputted from the motherboard on which the composite module 1 is mounted. A wiring electrode 22a provided on the component mounting surface 2a of the circuit board 2 and a matching circuit (not shown) formed of components 6 such as a capacitor, an inductor, and the like provided on the wiring electrode 22a, are connected to the antenna terminal 5a.

Note that in this embodiment, the configuration is such that the transmission signal (RF signal) is selectively outputted from one of the transmission terminals 2G/Tx and BT/Tx provided in the RFIC 3 by the switching circuit 41 provided in the FEM 4, and the transmission signals are not outputted simultaneously from the transmission terminals 2G/Tx and 5G/Tx. Furthermore, the reception terminal 2G/Rx of the RFIC 3 is used for the communication using both the Bluetooth® standard and the wireless LAN standard that employ RF signals in the 2.4 GHz band.

As described thus far, in this embodiment, the "first communication system" according to the present invention is configured by the communication function, provided in the RFIC 3, that is based on the wireless LAN standard using RF signals in the 2.4 GHz band, the FEM 4, the transmission path 10 that does not allow RF signals to pass simultaneously, and the reception path 11 that does allow RF signals to pass simultaneously. Meanwhile, the "second communication system" according to the present invention is configured by the communication function, provided in the RFIC 3, that is based on the wireless LAN standard using RF signals in the 5 GHz band, the FEM 5, the transmission path 20 that does not allow RF signals to pass simultaneously, and the reception path 21 that does allow RF signals to pass simultaneously.

Wiring Electrode Configuration

As shown in FIG. 3, in this embodiment, a wiring electrode 10a (transmission path wiring electrode) that forms the transmission path 10, a wiring electrode 11a (reception path wiring electrode) that forms the reception path 11, a wiring electrode 12a that forms the transmission path 12, a wiring electrode 20a (transmission path wiring electrode) that forms the transmission path 20, and a wiring electrode 21a (reception path wiring electrode) that forms the reception path 21 are formed, on the component mounting surface 2a that serves as one main surface of the circuit board 2, through a known technique such as screen printing using a conductive paste.

Furthermore, although not shown in the drawings, the signal paths 11 to 12, 20, and 21 are formed by providing components 6 for impedance adjustment and the like on the wiring electrodes 11a to 12a, 20a, and 21a, respectively, as appropriate. The wiring electrodes 10a and 20a, which form the respective transmission paths 10 and 20 that do not allow RF signals (transmission signals) to pass simultaneously, are disposed adjacent to each other, and are formed together in a central region of the circuit board 2 when viewed from above.

The wiring electrode 11a that forms the reception path 11 is formed so as to be distanced from the transmission path 10 (the wiring electrode 10a) in the region of the circuit board 2 in which the wiring electrodes used for the communication based on the 2.4 GHz-band wireless LAN standard are formed (an upper region in the drawing in FIG. 3). Likewise, the wiring electrode 21a that forms the reception path 21 is formed so as to be distanced from the transmission path 20 (the wiring electrode 20a) in the region of the circuit board 2 in which the wiring electrodes used for the communication based on the 5 GHz-band wireless LAN standard are formed (a lower region in the same drawing). The wiring electrode 12a that forms the transmission path 12 used for the communication based on the Bluetooth® standard is formed above the wiring electrode 11a that forms the reception path 11.

The antenna terminal 4a connected to the 2.4 GHz antenna ANT1 is formed at an end edge of an upper-left region of the circuit board 2, when viewed from above, in which the transmission path 10 (the wiring electrode 10a) and the reception path 11 (the wiring electrode 11a) for the 2.4 GHz-band wireless LAN are formed. Meanwhile, the antenna terminal 5a connected to the 5 GHz antenna ANT2 is formed at an end edge of a lower-left region of the circuit board 2, when viewed from above, in which the transmission path 20 (the wiring electrode 20a) and the reception path 21 (the wiring electrode 21a) for the 5 GHz-band wireless LAN are formed.

Manufacturing Method

Next, an overview of an example of a method for manufacturing the composite module 1 shown in FIG. 1 will be described.

First, the ceramic green sheets for forming the respective dielectric layers that configure the circuit board 2 are prepared, in which there are formed via conductors for interlayer connections by forming via holes using a laser or the like in the ceramic green sheets formed in a predetermined shape, filling the via holes with a conductive paste, carrying out via-fill plating, and so on, and then an electrode pattern that includes the wiring electrodes 10a to 12a, 20a, and 21a is printed using the conductive paste. Note that a plurality of the via conductors, electrode patterns including the wiring electrodes 10a to 12a, 20a, and 21a, and so on are provided on the respective ceramic green sheets so that many circuit boards 2 can be formed at once.

Next, the dielectric layers are stacked so as to form a multilayer body. Grooves for splitting the multilayer body into individual circuit boards 2 after firing are then formed so as to surround the regions corresponding to the respective circuit boards 2. Next, the multilayer body is pressurized and fired at a low temperature, forming a collection of circuit boards 2.

Next, before dividing the multilayer body into individual circuit boards 2, various types of electronic components such as the RFIC 3, the FEMs 4 and 5, the components 6, and so on are mounted on the component mounting surface 2a of the collection of circuit boards 2. After the electronic components have been mounted, the component mounting surface 2a of the collection of circuit boards 2 is covered with the molded resin 7, which is then thermally set. Grooves are then formed in the positions surrounding the regions, in the thermally-set molded resin 7 on the circuit boards 2, that correspond to the respective circuit board 2, or in other words, in the positions where the individual circuit boards 2 are to be divided. Furthermore, the shield layer 8 is provided on the molded resin 7 using a conductive paste, and a collection of the composite modules 1 is formed. The collection of composite modules 1 is then divided into individual modules, and the composite modules 1 are completed as a result.

Note that the manufacturing method for the composite module 1 is not limited to that described above, and the composite module 1 may be formed using a typical known manufacturing method. The circuit board 2 can be formed of a printed board, an LTCC, an alumina-based substrate, a glass substrate, a composite material substrate, a single-layer substrate, a multilayer substrate, or the like that uses resin, ceramics, polymer material, or the like, and the optimal material for the circuit board 2 may be selected as appropriate based on the application of the composite module 1.

According to the embodiment as described thus far, of the communication paths provided in the communication systems based on the 2.4 GHz-band and 5 GHz-band wireless LAN standards, the wiring electrodes 10a and 20a that form the transmission paths 10 and 20, respectively, through which RF signals do not pass simultaneously, are formed adjacent to each other in a central region of the component mounting surface 2a of the circuit board 2 when viewed from above. Furthermore, the wiring electrodes 11a and 21a that form the reception paths 11 and 21, respectively, through which the RF signals pass simultaneously are in both communication systems formed so as to be distanced from the respective transmission paths 10 and 20 in the region of the circuit board 2 on the side on which the corresponding communication system is provided. Accordingly, the RF signals do not simultaneously pass through the transmission paths 10 and 20, which are disposed near each other, and thus there is no risk that the RF signal passing through one of the signal paths will interfere with the RF signal passing through the other signal path. Furthermore, because the reception paths 11 and 21 are disposed so as to be distanced from the transmission paths 10 and 20, respectively, the isolation characteristics between the plurality of signal paths which are provided in the respective communication systems and through which the RF signals pass can be improved without using ground electrodes or the like as in the past.

Moreover, the reception paths 11 and 21 in the respective communication systems are disposed so as to be distanced from each other with the transmission paths 10 and 20, which are disposed adjacent to each other but have no risk of interfering with each other, provided therebetween. Accordingly, the RF signal from one of the communication systems can be prevented from entering the other communication system, which makes it possible to improve the isolation characteristics between the communication systems.

In other words, even if both communication systems that communicate using the respective predetermined frequency bands are disposed in the vicinity of each other, the transmission paths 10 and 20, through which RF signals do not pass simultaneously and thus which do not carry a risk of mutual interference, are disposed in the vicinity of each other, whereas the reception paths 11 and 21, through which RF signals do pass simultaneously and thus which do carry a risk of mutual interference, are disposed so as to be separated from each other, and thus the isolation characteristics between the communication systems that are disposed in the vicinity of each other can be improved. Accordingly, the size of the composite module 1 can be reduced and the level of integration thereof increased by disposing the communication systems in the vicinity of each other.

In addition, the wiring electrodes 10a and 20a that form the transmission paths 10 and 20, through which RF signals do not pass simultaneously and which therefore do not carry a risk of mutual interference, are formed together in a central region of the circuit board 2 when viewed from above. Accordingly, when the reception paths 11 and 21 provided in the communication systems and the transmission path 12 for the communication using the Bluetooth® standard are disposed on the circuit board 2, the wiring electrodes 11a and 21a that form the reception paths 11 and 21, respectively, and the wiring electrode 12a that forms the transmission path 12 can be disposed in a peripheral edge region of the circuit board 2 when viewed from above. This increases the freedom of the locations where the wiring electrodes 11a, 12a, and 21a can be disposed on the circuit board 2, which by extension increases the freedom of design for the composite module 1.

Furthermore, because the wiring electrodes 10a and 20a that form the transmission paths 10 and 20, respectively, are formed together in a central region of the circuit board 2 when viewed from above, the optimal positions for reducing the interference with the RF signals that flow through the transmission paths 10 and 20 can easily be determined for where the other wiring electrodes are to be disposed on the circuit board 2.

In addition, the wiring electrodes 10a to 12a, 20a, and 21a are formed on the component mounting surface 2a of the circuit board 2, and thus, compared to a case where ground electrodes are provided between the respective wiring electrodes, the wiring electrodes are provided within the circuit board 2 in order to dispose the wiring electrodes so as to be distanced from each other, and so on for the purpose of improving the isolation characteristics between the respective wiring electrodes, as is found in conventional techniques, the wiring electrodes 10a to 12a, 20a, and 21a can be formed on the component mounting surface 2a of the circuit board 2 with a high level of precision by using a technique such as photolithography, screen printing, or the like. Moreover, only the influence that the electrode pattern provided on the bottom layer of the wiring electrodes 10a to 12a, 20a, and 21a has on the impedance characteristics need be taken into consideration, and as such, impedance adjustment and the like of the wiring electrodes 10a to 12a, 20a, and 21a can be carried out with ease.

Although RF signals for communications are inputted and outputted via the respective antenna terminals 4a and 5a, the antenna terminals 4a and 5a are disposed distanced from each other on the upper-left and lower-left, respectively, of the component mounting surface 2a of the circuit board 2.

Accordingly, the RF signals used in the respective communication systems can be prevented from interfering with each other through the antenna terminals 4a and 5a, and the isolation characteristics of both communication systems can be further improved.

Note that the present invention is not intended to be limited to the aforementioned embodiment, and many variations aside from the content described above can be made without departing from the essential spirit of the present invention. For example, the composite module 1 may include yet another communication system, and the wiring electrodes that form the signal paths, of the plurality of signal paths provided in the respective communication systems through which RF signals do not pass simultaneously, provided respectively in at least two of those communication systems may be formed adjacent to each other in a predetermined region of the circuit board 2.

By employing such a configuration, the wiring electrodes that form the signal paths, of the plurality of signal paths through which RF signals do not pass simultaneously, provided respectively in at least two of the communication systems are formed together so as to be adjacent to each other in a predetermined region of the circuit board 2. Accordingly, the respective wiring electrodes that form the other signal paths in the communication systems can be disposed in other regions of the circuit board 2 so as to be separated from each other. Accordingly, the RF signals do not simultaneously pass through the signal paths that are disposed near each other, and thus there is no risk that the RF signal passing through one of the signal paths will interfere with the RF signal passing through the other signal path. Furthermore, because the other signal paths are disposed so as to be distanced therefrom, the isolation characteristics between the plurality of signal paths which are provided in the respective communication systems and through which the RF signals pass can be improved without using ground electrodes or the like as in the past.

Meanwhile, although the wiring electrodes that form the signal paths through which RF signals do not pass simultaneously (the wiring electrodes 10a and 20a for the transmission paths) are in the aforementioned embodiment formed on the component mounting surface 2a of the circuit board 2 so as to be adjacent to each other when viewed from above, the wiring electrodes may be disposed adjacent to each other in the layering direction of the circuit board 2 by providing at least one of the wiring electrodes within the circuit board 2. By employing such a configuration, the surface area occupied by each signal path when viewed from above can be reduced, which makes it possible to further reduce the size of the circuit board 2 and in turn reduce the size of the composite module 1.

Finally, the positions where the wiring electrodes that form the signal paths through which RF signals do not pass simultaneously are disposed are not limited to the central region of the circuit board 2 when viewed from above, and the wiring electrodes that form the respective signal paths may be disposed in any position of the circuit board, such as an end edge of the region of the circuit board when viewed from above, different layers in the case where a multilayer substrate is used, or the like, for example.

The present invention is not limited to being embodied as the specific composite module described as an example above, and can be widely applied in composite modules including circuit boards on which a plurality of communication systems that communicate using the respective predetermined frequency bands are provided.

1 composite module
2 circuit board
3 RFIC (first and second communication systems)
4 front-end module (first communication system)
4a antenna terminal (first antenna terminal)
5 front-end module (second communication system)
5a antenna terminal (second antenna terminal)
10 transmission path (signal path)
10a wiring electrode (transmission path wiring electrode)
11 reception path (signal path)
11a wiring electrode (reception path wiring electrode)
12 transmission path (signal path)
12a wiring electrode
20 transmission path (signal path)
20a wiring electrode (transmission path wiring electrode)
21 reception path (signal path)
21a wiring electrode (reception path wiring electrode)

The invention claimed is:

1. A composite module comprising a circuit board having a plurality of communication systems provided thereon, wherein the plurality of communication systems communicate using respective predetermined frequency bands,
   wherein each of the communication systems includes a plurality of signal paths allowing RF signals to pass; and
   wiring electrodes forming signal paths not allowing the RF signals to pass simultaneously, among the plurality of signal paths and provided respectively in at least two of the communication systems are formed together so as to be adjacent to each other in a predetermined region of the circuit board,
   wherein the plurality of communication systems are first and second communication systems;
   each of the first and second communication systems includes a transmission path not allowing the RF signals to pass simultaneously and a reception path allowing the RF signals to pass simultaneously as the signal paths;
   transmission path wiring electrodes each forming the transmission paths are formed in the circuit board so as to be disposed adjacent to each other when viewed from above;
   a reception path wiring electrode forming the reception path of the first communication system is formed in a region of the circuit board closer to the first communication system; and
   a reception path wiring electrode that forms the reception path of the second communication system is formed in a region of the circuit board closer to the second communication system.

2. The composite module according to claim 1, wherein the wiring electrodes forming the signal paths not allowing the RF signals to pass simultaneously are formed together in a central region of the circuit board when viewed from above.

3. The composite module according to claim 2, wherein the wiring electrodes are formed on one main surface of the circuit board.

4. The composite module according to claim 1, wherein the wiring electrodes are formed on one main surface of the circuit board.

5. The composite module according to claim 1, wherein the first communication system includes a first antenna terminal and the second communication system includes a second antenna terminal;
   the first antenna terminal is formed at an end edge of a region of the circuit board in which the transmission path wiring electrode and the reception path wiring electrode of the first communication system are formed; and the second antenna terminal is formed at an end edge of a region of the circuit board in which the transmission path wiring electrode and the reception path wiring electrode of the second communication system are formed.

6. The composite module according to claim 1, wherein the wiring electrodes, the transmission path wiring electrodes, and the reception path wiring electrodes connect front end modules corresponding to the plurality of communication systems with a radio frequency integrated circuit.

* * * * *